United States Patent
Smith

(10) Patent No.: US 11,031,778 B2
(45) Date of Patent: Jun. 8, 2021

(54) HIGH-VOLTAGE TOLERANT BI-DIRECTIONAL ELECTROSTATIC DISCHARGE PROTECTION CIRCUIT

(71) Applicant: Silicon Laboratories Inc., Austin, TX (US)

(72) Inventor: Jeremy C. Smith, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 206 days.

(21) Appl. No.: 16/199,609

(22) Filed: Nov. 26, 2018

(65) Prior Publication Data
US 2020/0169079 A1 May 28, 2020

(51) Int. Cl.
*H02H 9/04* (2006.01)
*H01L 27/02* (2006.01)
*H01L 29/739* (2006.01)

(52) U.S. Cl.
CPC ......... *H02H 9/046* (2013.01); *H01L 27/0262* (2013.01); *H01L 27/0266* (2013.01); *H01L 27/0292* (2013.01); *H01L 29/7394* (2013.01)

(58) Field of Classification Search
CPC ............ H01L 27/0248; H01L 27/0251; H01L 27/027; H01L 27/0285; H01L 27/0262; H01L 29/7394; H01L 27/0292; H01L 27/0266; H01L 29/0653; H01L 29/1095; H02H 9/046; H02H 7/0007
See application file for complete search history.

(56) References Cited

U.S. PATENT DOCUMENTS

| | | | |
|---|---|---|---|
| 6,888,710 B2 * | 5/2005 | Mallikarjunaswamy | ..................... H01L 27/0259 257/E29.197 |
| 10,063,048 B2 | 8/2018 | Smith | |
| 2010/0276728 A1 * | 11/2010 | Hsieh | .................. H01L 29/7811 257/139 |
| 2013/0027822 A1 | 1/2013 | Smith | |
| 2013/0027834 A1 | 1/2013 | Smith | |
| 2015/0049406 A1 * | 2/2015 | Besse | ........................ H02H 9/02 361/57 |
| 2015/0187583 A1 * | 7/2015 | Montgomery | ........ H01L 21/266 438/238 |
| 2015/0194417 A1 | 7/2015 | Smith | |
| 2016/0336744 A1 * | 11/2016 | Parthasarathy | ........ H02H 9/046 |
| 2017/0346276 A1 * | 11/2017 | Scanlon | .................. H01L 23/60 |
| 2019/0131787 A1 * | 5/2019 | He | ....................... H01L 29/7408 |

OTHER PUBLICATIONS

Silicon Labs, "Automotive MCU Solutions from Silicon Labs," 38 pages, published at least as early as Oct. 2018.
John Griffith, Texas Instruments, "What do CAN bus signals look like?," 4 pages, Jun. 4, 2015.

* cited by examiner

*Primary Examiner* — Alex Torres-Rivera
(74) *Attorney, Agent, or Firm* — Trop, Pruner & Hu, P.C.

(57) ABSTRACT

In an embodiment, an apparatus includes: a signal pad; a first diode having a first terminal coupled to the signal pad and a second terminal, the first diode having a first polarity; a second diode having a second terminal coupled to the signal pad and a first terminal, the second diode having a second polarity; a first insulated gate bipolar transistor (IGBT) having a first polarity, the first IGBT coupled between the second terminal of the first diode and a reference voltage node; and a second IGBT having the first polarity, the second IGBT coupled between the first terminal of the second diode and the reference voltage node.

19 Claims, 4 Drawing Sheets

US 11,031,778 B2

HIGH-VOLTAGE TOLERANT BI-DIRECTIONAL ELECTROSTATIC DISCHARGE PROTECTION CIRCUIT

BACKGROUND

Electrostatic discharge (ESD) refers to the phenomenon where an electrical current of high amplitude and short duration is discharged at a package terminal of an integrated circuit (IC) due to static charge build-up on a nearby object, such as a human being or an IC handling machine. ESD can also occur when the integrated circuit itself becomes charged due to triboelectric charging (friction charging) or by proximity to an ionizing field and is subsequently discharged by contact with a nearby grounded conductor. Without ESD protection circuitry, an ESD event can damage the IC. Accordingly, circuit designers have developed ESD protection circuitry to discharge ESD currents in a short time in a nondestructive manner.

A diode string is one type of ESD circuit that can be used to discharge ESD currents. The diode string is formed in bulk material of a semiconductor substrate by series-connecting P-N junctions typically formed in n-well regions. In particular, each n-well formed in the P-type bulk material is tapped via an n+ diffusion and is connected to the p+ terminal of the next diode. The combination of a P+ diffusion contained in an n-well over a P-type substrate forms a parasitic PNP transistor by default, such that the "diode string" is really a chain of PNP transistors. However, to dissipate a power event using such diode strings, the diode string is connected to each exposed terminal, and the size of the diode string is selected to dissipate worst-case ESD event, which results in the inclusion of multiple circuit components that are only used occasionally, if ever. Another concern with conventional ESD circuits is that they can only protect as to ESD events of a given direction of current.

SUMMARY OF THE INVENTION

In one aspect, an apparatus includes: a signal pad; a first diode having a first terminal coupled to the signal pad and a second terminal, the first diode having a first polarity; a second diode having a second terminal coupled to the signal pad and a first terminal, the second diode having a second polarity; a first insulated gate bipolar transistor (IGBT) having a first polarity, the first IGBT coupled between the second terminal of the first diode and a reference voltage node; and a second IGBT having the first polarity, the second IGBT coupled between the first terminal of the second diode and the reference voltage node.

In an example, the first IGBT has a first terminal coupled to the second terminal of the first diode and a second terminal coupled to the reference voltage node. The second IGBT may have a second terminal coupled to the first terminal of the second diode and a first terminal coupled to the reference voltage node. The apparatus may further include: a first resistance coupled between a third terminal of the first IGBT and the second terminal of the first IGBT; and a second resistance coupled between a third terminal of the second IGBT and the second terminal of the second IGBT. The first and second resistances may be diffusion resistors.

In an example, the first IGBT is to discharge a current of a first direction between the signal pad and the reference voltage node when a voltage between the signal pad and the reference voltage node is at least at a first trigger voltage level. And the second IGBT is to discharge a current of a second direction between the signal pad and the reference voltage node when a voltage between the signal pad and the reference voltage node is at least at a second negative trigger voltage level. The apparatus may be an integrated circuit package including: a first semiconductor die comprising the first and second diodes and the first and second IGBTs, and an output buffer coupled to the signal pad; and a second semiconductor die coupled to the first semiconductor die, the second semiconductor die to communicate sensing information via the output buffer. The integrated circuit package may couple to a bus, and the first diode, the second diode, the first IGBT and the second IGBT comprise an electrostatic discharge protection circuit to protect the signal pad and the output buffer from an electrostatic discharge event on the bus. In an example, the first and second IGBTs are formed as closed cell structures.

In another aspect, an apparatus includes: a first semiconductor die comprising: an output signal pad; a first diode having a cathode and an anode, the anode coupled to the output signal pad; a second diode having an anode and a cathode, the cathode coupled to the output signal pad; a first IGBT coupled to the cathode of the first diode, the first IGBT comprising a silicon-on-insulator (SOI) device structure coupled to form a first embedded parasitic silicon controlled rectifier (SCR) between the first diode and a reference voltage node, where the first diode is to direct an electrostatic discharge (ESD) current of a first polarity to the first IGBT and the first IGBT is to discharge the ESD current of the first polarity through the reference voltage node; and a second IGBT coupled to the anode of the second diode, the second IGBT comprising the SOI device structure coupled to form a second embedded parasitic SCR between the second diode and the reference voltage node, where the second diode is to direct an ESD current of a second polarity to the second IGBT and the second IGBT is to discharge the ESD current of the second polarity from the reference voltage node to the output signal pad.

In an example, the first IGBT comprises an emitter coupled to the cathode of the first diode, a collector coupled to the reference voltage node, and a gate terminal coupled to the reference voltage node via a first resistor. The second IGBT may be a collector coupled to the anode of the second diode, an emitter coupled to the reference voltage node, and a gate terminal coupled to the anode of the second diode via a second resistor. The first and second resistors may be diffusion resistors formed in an oxide isolated tub layer.

In an example, the apparatus comprises an integrated circuit package including: the first semiconductor die having an output buffer coupled to the output signal pad; and a second semiconductor die coupled to the first semiconductor die, the second semiconductor die comprising an isolator. The integrated circuit package may couple to a bus, the first semiconductor die comprising an ESD protection circuit to protect against bi-directional ESD current communicated via the bus. The ESD protection circuit may provide at least 10 Amperes of HBM ESD current protection between a line of the bus and the reference voltage node and at least −10 Amperes of HBM ESD current between the line of the bus and the reference voltage node. The first semiconductor die may include a plurality of ESD protection circuits, each of the plurality of ESD protection circuits comprising a first diode coupled between a signal pad and a first IGBT and a second diode coupled between the signal pad and a second IGBT, the first and second IGBTs further coupled to the reference voltage node.

In yet another aspect, a method includes: directing a first ESD current of a first direction from a first signal pad to a ground supply node, via a first portion of an ESD protection circuit, the first portion of the ESD protection circuit comprising: a first diode having a first terminal coupled to the first signal pad and a second terminal; and a first IGBT coupled between the second terminal of the first diode and the ground supply node; and directing a second ESD current of a second direction from the ground supply node to the first signal pad, via a second portion of the ESD protection circuit, the second portion of the ESD protection circuit comprising: a second diode having a second terminal coupled to the first signal pad and a first terminal; and a second IGBT coupled between the first terminal of the second diode and the ground supply node.

In an example, the method further comprises providing bi-directional ESD protection to the first signal pad via the ESD protection circuit.

DETAILED DESCRIPTION

In various embodiments, an electrostatic discharge (ESD) protection circuit is provided to enable protection of components of an integrated circuit that may couple to a given bus or other interconnect. More specifically embodiments herein provide a protection circuit that can protect against bi-directional ESD currents. In the particular embodiments described herein, the protection circuit may be used in connection with integrated circuits that couple to a controller area network (CAN) bus. According to a CAN bus specification, devices are specified to handle large positive and negative voltage swings (e.g., swings of +60 volts (V) to −60 V). With this specified arrangement, large negative swings may exist in operation. Desirably, an IC may be designed to have high levels of ESD tolerance for implementation in a CAN bus-based system. For example, it may be desirable to maintain an ESD tolerance of +/−15 kV human body model (HBM). To realize ESD protection for such large voltage swings, and particularly for the large negative voltage swings, a diode-based implementation as is commonly used may not be feasible.

As such, embodiments provide ESD protection by way of an N-channel insulated gate bipolar transistor (NiGBT). However, note that such NiGBT devices are not symmetric structures and cannot operate in reverse. Thus a single NiGBT device is incapable of providing ESD protection for bi-directional ESD currents. As such, embodiments provide a protection circuit having multiple IGBTs that are oppositely connected to enable protection against bi-directional ESD currents. To this end, embodiments may associate a given NiGBT with a corresponding diode device that acts to steer an ESD current of a given polarity to an appropriately configured NiGBT to discharge an electrostatic event.

Figure 1:
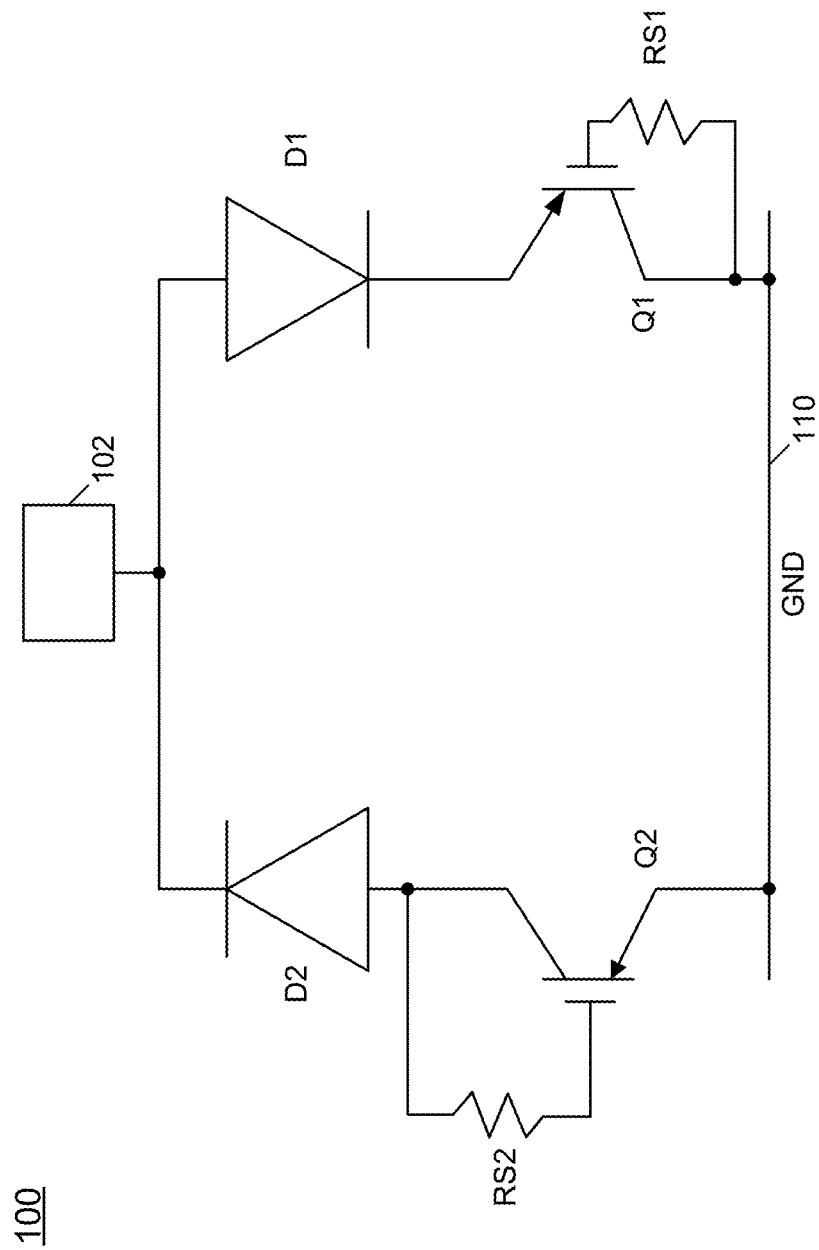
FIG. 1 is a schematic diagram of an output circuit having a protection circuit in accordance with an embodiment.

Referring now to FIG. 1, shown is a schematic diagram of an output circuit having a protection circuit in accordance with an embodiment in accordance with an embodiment. As shown in FIG. 1, output circuit 100 includes a signal pad 102 configured to communicate information between an integrated circuit of which signal pad 102 is a part and a bus or other interconnect to which circuit 100 couples. In a representative example, signal pad 102 may be an output pad to output information from an output buffer (not shown for ease of illustration in FIG. 1).

As further illustrated, a pair of diodes connected in opposite polarity to signal pad 102. Specifically, a first diode D1 has an anode terminal coupled to signal pad 102. In turn, a cathode terminal of diode D1 couples to a first NiGBT (hereafter referred to generally as an insulated gate bipolar transistor (IGBT)) Q1. In an embodiment, diode D1 may be implemented as a high voltage diode, e.g., an 80V device. In the embodiment shown in FIG. 1, IGBT Q1 is implemented as a PNP transistor. In a particular embodiment, IGBT Q1 may form part of an embedded parasitic silicon controlled rectifier (SCR) formed as a silicon-on-insulator (SOI) device structure. In the embodiment shown, the cathode terminal of D1 couples to an emitter terminal of IGBT Q1. In turn, IGBT Q1 has a collector terminal coupled to a node 110 that is coupled to a reference voltage rail, namely a ground potential. As further illustrated, IGBT Q1 has a base terminal coupled to its collector terminal via a source resistance ($R_{s1}$).

As further shown in FIG. 1, a second diode D2 has a cathode terminal coupled to signal pad 102. In turn, an anode terminal of diode D2 couples to a second IGBT Q2, which may be a PNP transistor, i.e., part of an embedded SCR oppositely connected from IGBT Q1. In an embodiment, diode D2 also may be implemented as a high voltage diode. In the embodiment shown, the anode terminal of D2 couples to a collector terminal of IGBT Q2. In turn, IGBT Q2 has an emitter terminal coupled to node 110. As further illustrated, IGBT Q2 has a base terminal coupled to its collector terminal via a source resistance ($R_{s2}$). While shown at this high level in the embodiment of FIG. 1, many variations and alternatives are possible.

With embodiments herein, both positive and negative direction ESD events can be handled. This is so, in that although an IGBT is not a symmetric structure that can be run in reverse, with multiple IGBTs oppositely connected, currents of different polarities can be steered via corresponding diodes D1, D2 to the appropriate IGBT (Q1, Q2). With the arrangement in FIG. 1, an ESD protection circuit is realized to steer ESD currents of given polarities to the appropriate IGBTs. That is, a positive current is directed via diode D1 and through IGBT Q1 to be discharged via the reference voltage rail. In turn, a negative current flowing from the reference voltage rail is directed via diode D2 and through IGBT Q2 to be discharged to signal node 102.

Accordingly, when a voltage between signal pad 102 and node 110 exceeds a trigger voltage of IGBT Q1, a positive ESD current may be discharged via diode D1 steering the current through IGBT Q1. Similarly, when a voltage between signal pad 102 and node 110 exceeds a trigger voltage of IGBT Q2, a negative ESD current may be discharged via diode D2 steering the current through IGBT Q2.

Figure 2:
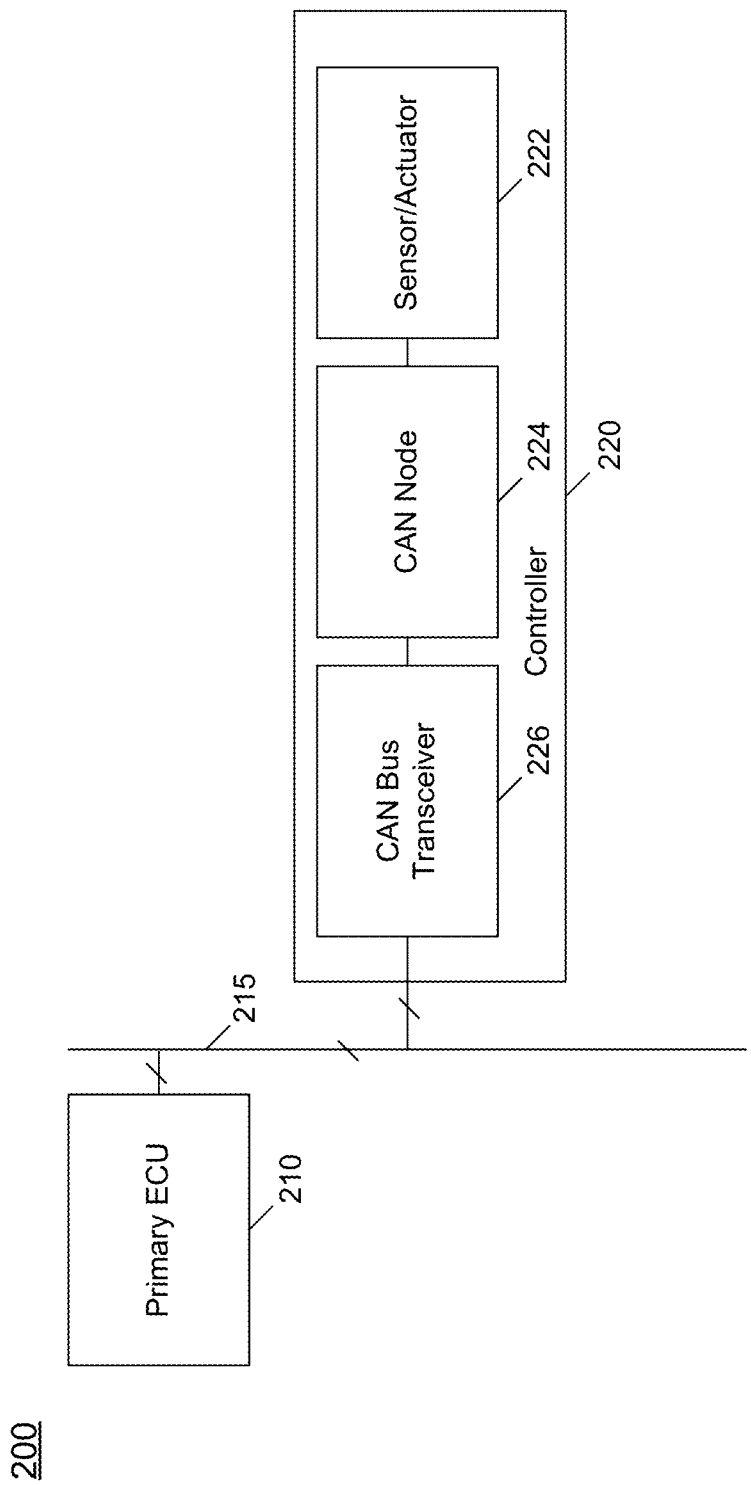
FIG. 2 is a block diagram of a portion of a system in accordance with an embodiment.

Referring now to FIG. 2, shown is a block diagram of a portion of a system in accordance with an embodiment. As shown in FIG. 2, system 200 may be a portion of an in-vehicle electronics system that may include a wide variety of components, including mixed signal components to perform various monitoring, sensing, control and other operations. In a vehicle configuration, such components may be used for a variety of purposes, including for providing vehicle telematics, controlling various systems of the vehicle, both in manual and autonomous driving implementations among others.

In the high level shown in FIG. 2, a primary electrical control unit 210 is a master control system for interacting with a variety of different electrical components. In turn, primary electrical control unit 210 couples to a bus 215 which in one embodiment may be a controller area network (CAN) bus 215. Note that CAN bus 215 may be implemented with a two-wire topology such that communication of signals is performed differentially. According to CAN bus specification, large positive and negative signal swings are contemplated (compliance dictates a range of +60V to −60V). Further, ESD protection desirably may be provided at a level of +/−15 kV HBM, which is equivalent to a +/−10 Ampere (A) discharge current, which is applied between the high and low signal lines (CANH and CANL) and ground. A protection circuit as described above in FIG. 1 may provide such protection. As such, devices coupled to bus 215 including, e.g., primary ECU 210 and/or a controller 220, may leverage ESD protection by implementation of one or more protection circuits as described herein.

In an embodiment, controller 220 may be implemented as a given integrated circuit package such as a multichip module (MCM). More specifically as shown in FIG. 2, controller 220 includes at least one sensor/actuator 222, a CAN node 224 and a CAN bus transceiver 226. In an embodiment, sensor/actuator 222 may include at least one sensing device to sense some environmental parameter and communicate that information as sensed information via CAN node 224 and CAN bus transceiver 226 to, e.g., primary ECU 210. As another example, sensor/actuator 222 may include at least one actuator, motor or other component to perform an operation in response to command information, e.g., receive from primary ECU 210. In this manner, primary ECU 210 may send a command via bus 215 to be received within controller 220, and more specifically via transceiver 226, CAN node 224 and to sensor/actuator 222. Note that an embodiment in which CAN bus transceiver 226 includes both input and output pads, ESD protection circuits as described herein may be associated with each corresponding input or output pad. More generally, a given ESD protection circuit may be associated with each signal pad present in CAN bus transceiver 226. Note that in the embodiment of FIG. 2, controller 220 may thus include multiple individual semiconductor die, however embodiments are not limited in this regard and it is possible for the various components in controller 220 to be implemented in a single semiconductor die. Also, understand that controller 220 may further include one or more isolators.

In embodiments herein, CAN bus transceiver 226 may include at least an output buffer or other driver that may controllably couple between a first supply rail and a second supply rail (namely between a high voltage supply rail and a ground supply rail). Additionally, CAN bus transceiver 226 includes a signal pad to output signal information either at the high voltage or ground level. In addition, CAN bus transceiver 226 may include an ESD circuit as discussed above with regard to FIG. 1 to thus protect against ESD events that may occur on bus 215. Understand while shown at this high level in the embodiment of FIG. 2, many variations and alternatives are possible. Furthermore, understand that in situations where there may be multiple channels to communicate via bus 215, CAN bus transceiver 226 may include multiple instantiations of output buffers, drivers or so forth, along with corresponding output pads and ESD circuits as described herein.

Understand that while IGBTs Q1 and Q2 described in FIG. 1 are shown in a simplified schematic form, each IGBT device as fabricated may include additional components including a parasitic bipolar transistor (e.g., an NPN bipolar transistor) and further a metal oxide semiconductor field effect transistor (MOSFET). In such arrangement, the parasitic bipolar transistor (referred to herein as QP) has a collector coupled to a base of IGBT Q1, a base coupled to the collector of IGBT Q1 and an emitter also coupled to the collector of IGBT Q1. In turn, the MOSFET, referred to herein as MOSFET M1, may be an N-channel MOS device having drain and gate terminals connected to the base of IGBT Q1, and a source terminal coupled to the collector terminal of IGBT Q1. Of course parasitic capacitances also may be present.

Figure 3:
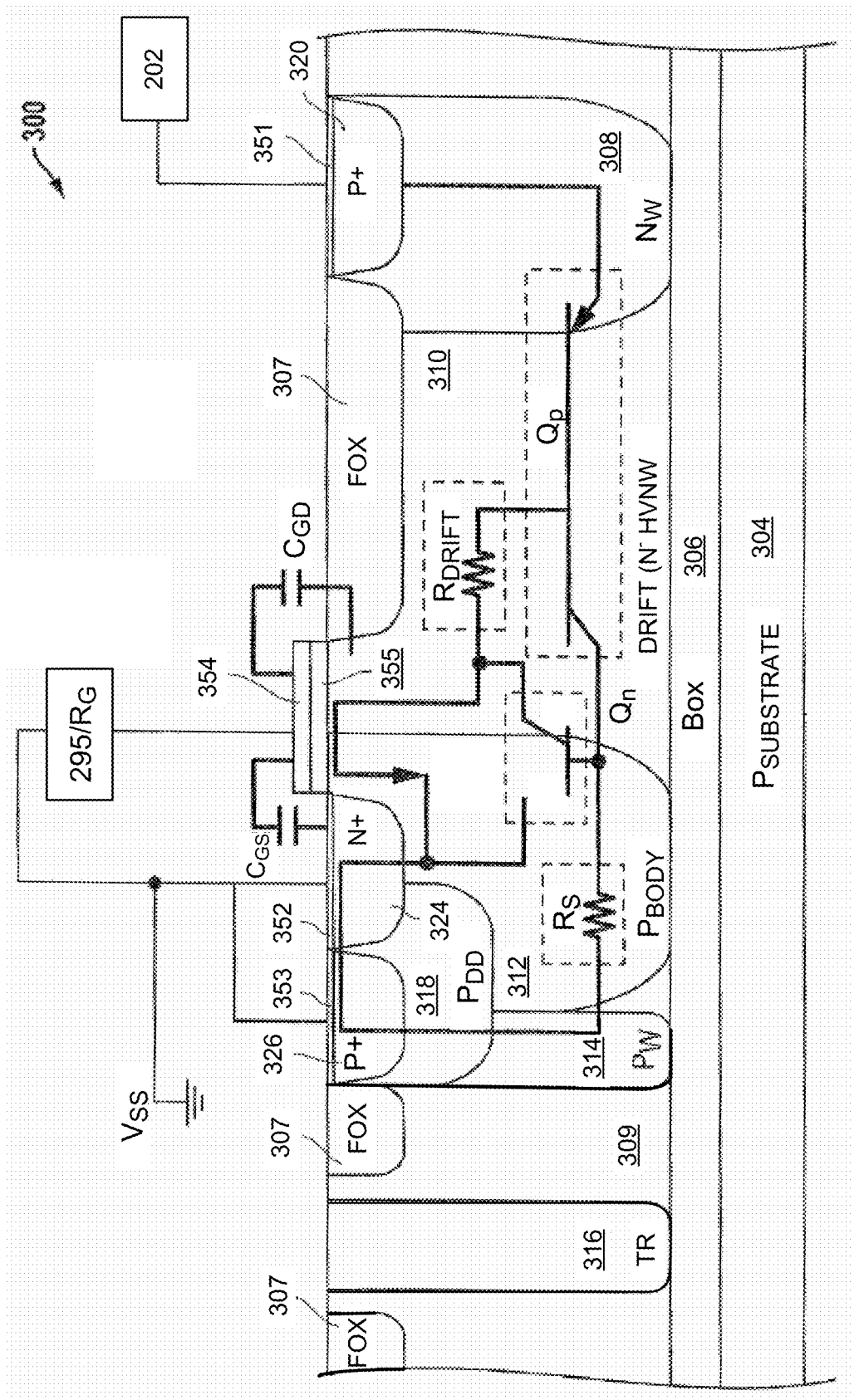
FIG. 3 is a partial cross-section of a silicon-on-insulator (SOI) device structure of an insulated gate bipolar transistor in accordance with one embodiment.

FIG. 3 is a partial cross-section of a SOI device structure 300 of an insulated gate bipolar transistor in accordance with an embodiment. In this embodiment, NiGBT structure 300 includes a buried oxide (e.g., BOX) layer 306 and top silicon semiconductor layer 309 (e.g., silicon) formed on a P-type substrate 304. In this embodiment, a Pbody body region 312 and Nwell 308 (that are separated by a lightly doped (N−) high voltage Nwell drift region 310) are formed in top silicon semiconductor layer 309 above BOX (e.g., silicon dioxide) layer 306 as shown. As further shown, a Pwell 314 is formed in top silicon semiconductor layer 309 adjacent Pbody body region 312, and a $P_{DD}$ region 318 is formed in Pwell 314 and Pbody body region 312. P+ doped region 320 is formed within Nwell 308 to form an anode of NiGBT device structure 300 that is coupled to signal output signal pad 202 by conductive (e.g., metal) pad 351. N+ doped region 324 and P+ doped region 326 are formed within lightly doped $P_{DD}$ region 318 and Pwell 314 to form a cathode of NiGBT device structure 300 that is coupled to ground via conductive (e.g., metal) pads 353 and 352 as shown.

In this configuration, N+ doped region 324 forms a source terminal for NMOS transistor M1, P+ doped region 326 forms a body terminal for NMOS transistor M1, while Nwell drift region 310 and Nwell 308 together form a drain for NMOS transistor M1. Conductive (e.g., polysilicon) gate terminal 354 and gate oxide 355 for NMOS transistor M1 are formed as shown above Pbody body region 312 and Nwell drift region 310, with gate terminal 354 being coupled as shown to ground (via gate control circuit 295) and parallel gate resistor $R_G$. Also shown in FIG. 3 are field oxide regions 307 and deep trench isolation region 316 that is formed in top silicon semiconductor layer 309.

Still referring to FIG. 3, PNP bipolar transistor QP and parasitic NPN bipolar transistor QN are elements of IGBT Q1 of FIG. 1, and are illustrated in relation to the respective components of NiGBT device structure 300 of FIG. 3. Also illustrated are gate-to-drain capacitance ($C_{GD}$) and gate-to-source capacitance ($C_{GS}$) of NMOS transistor M1. Noted here is that since the body of NMOS transistor M1 is shorted in metal to its source $C_{GS}$=gate-to-body capacitance ($C_{GB}$).

In embodiments, note that resistors RS may be implemented as diffusion resistors that are formed in oxide isolated tubs. In other embodiments, the resistances may be implemented as polysilicon resistors. In a particular embodiment, the resistances may be configured to have a resistance of approximately 1 kΩ.

Figure 4:
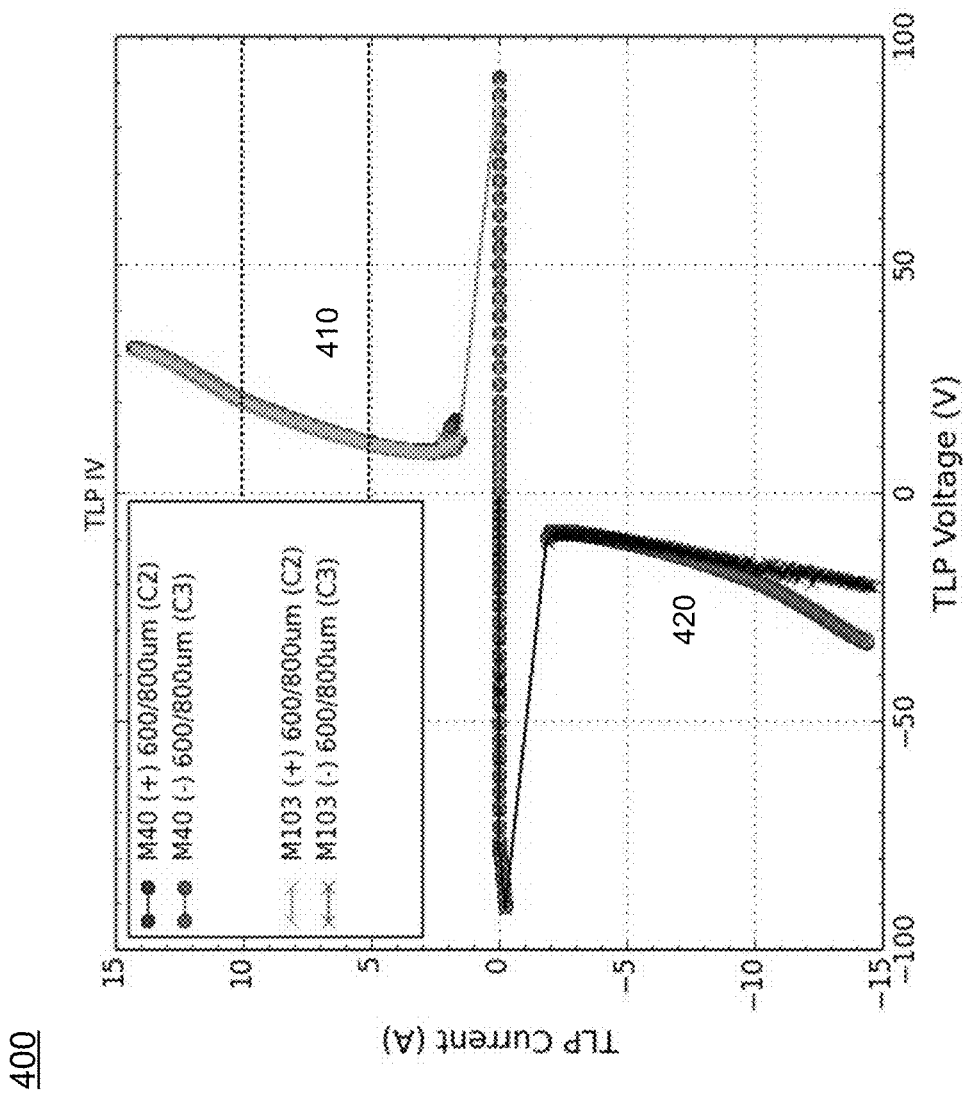
FIG. 4 is a graphical illustration detailing both positive and negative transmission line pulse (TLP) capabilities of a protection circuit in accordance with an embodiment.

Referring now to FIG. 4, shown is a diagram comparing current versus voltage to illustrate the ability of an ESD circuit as described herein to perform both positive and negative transmission line pulse (TLP) capabilities. As seen, in both a positive direction 410 and a negative direction 420, an ESD circuit as described herein can direct bidirectional ESD currents via an appropriate shunt mechanism to thus protect signal pads, transceiver circuitry and additional circuitry from ESD events as described herein.

In the illustration of FIG. 4, note that different sizings of diodes and IGBTs may be used in different implementations to provide sufficient ESD protection. In example implementations as illustrated in FIG. 4, a diode may be selected having a width of approximately 800 microns, while in turn a width of a corresponding IGBT may have a length of approximately 600 microns. Note that in embodiments, the IGBTs and diodes may be formed of closed cell configurations, such as so-called race track designs.

As illustrated in FIG. 4, via an ESD circuit as described herein, ESD protection provides a useful protection region within snapback curves 410, 420 in which the IGBTs conduct ESD events in a bipolar region. More specifically as illustrated in the inset of FIG. 4, several examples of devices are shown for the corresponding snap back curves. More particularly, key M40 in the inset illustrates an example using diffused resistors having the dimensions above. Similarly, key M103 corresponds to these devices formed with polysilicon resistors. Of course differently sized devices, and resistors formed in different manners may be present in other embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An integrated circuit package comprising:
    a first semiconductor die comprising:
        a signal pad;
        a first diode having a first terminal coupled to the signal pad and a second terminal, the first diode having a first polarity;
        a second diode having a second terminal coupled to the signal pad and a first terminal, the second diode having a second polarity;
        a first insulated gate bipolar transistor (IGBT) having a first polarity, the first IGBT coupled between the second terminal of the first diode and a reference voltage node;
        a second IGBT having the first polarity, the second IGBT coupled between the first terminal of the second diode and the reference voltage node; and
        an output buffer coupled to the signal pad; and
    a second semiconductor die coupled to the first semiconductor die, the second semiconductor die to communicate sensing information via the output buffer.

2. The integrated circuit package of claim 1, wherein the first IGBT comprises a first terminal coupled to the second terminal of the first diode and a second terminal coupled to the reference voltage node.

3. The integrated circuit package of claim 2, wherein the second IGBT comprises a second terminal coupled to the first terminal of the second diode and a first terminal coupled to the reference voltage node.

4. The integrated circuit package of claim 3, further comprising:
    a first resistance coupled between a third terminal of the first IGBT and the second terminal of the first IGBT; and
    a second resistance coupled between a third terminal of the second IGBT and the second terminal of the second IGBT.

5. The integrated circuit package of claim 1, wherein the first IGBT is to discharge a current of a first direction between the signal pad and the reference voltage node when a voltage between the signal pad and the reference voltage node is at least at a first trigger voltage level.

6. The integrated circuit package of claim 5, wherein the second IGBT is to discharge a current of a second direction between the signal pad and the reference voltage node when a voltage between the signal pad and the reference voltage node is at least at a second negative trigger voltage level.

7. The integrated circuit package of claim 1, wherein the integrated circuit package is to couple to a bus, and the first diode, the second diode, the first IGBT and the second IGBT comprise an electrostatic discharge protection circuit to protect the signal pad and the output buffer from an electrostatic discharge event on the bus.

8. An apparatus comprising:
    a first semiconductor die comprising:
        an output signal pad;
        a first diode having a cathode and an anode, the anode coupled to the output signal pad;
        a second diode having an anode and a cathode, the cathode coupled to the output signal pad;
        a first insulated gate bipolar transistor (IGBT) coupled to the cathode of the first diode, the first IGBT comprising a silicon-on-insulator (SOI) device structure coupled to form a first embedded parasitic silicon controlled rectifier (SCR) between the first diode and a reference voltage node, wherein the first diode is to direct an electrostatic discharge (ESD) current of a first polarity to the first IGBT and the first IGBT is to discharge the ESD current of the first polarity through the reference voltage node, wherein the first IGBT comprises an emitter directly coupled to the cathode of the first diode and a collector directly coupled to the reference voltage node; and
        a second IGBT coupled to the anode of the second diode, the second IGBT comprising the SOI device structure coupled to form a second embedded parasitic SCR between the second diode and the reference voltage node, wherein the second diode is to direct an ESD current of a second polarity to the second IGBT and the second IGBT is to discharge the ESD current of the second polarity from the reference voltage node to the output signal pad, wherein the second IGBT comprises a collector directly coupled to the anode of the second diode and an emitter directly coupled to the reference voltage node.

9. The apparatus of claim 8, wherein the first IGBT further comprises a gate terminal coupled to the reference voltage node via a first resistor.

10. The apparatus of claim 9, wherein the second IGBT further comprises a gate terminal coupled to the anode of the second diode via a second resistor.

11. The apparatus of claim 10, wherein the first and second resistors comprise diffusion resistors formed in an oxide isolated tub layer.

12. The apparatus of claim 8, wherein the apparatus comprises an integrated circuit package including:
    the first semiconductor die having an output buffer coupled to the output signal pad; and a second semiconductor die coupled to the first semiconductor die, the second semiconductor die comprising an isolator.

13. The apparatus of claim 12, wherein the integrated circuit package is to couple to a bus, the first semiconductor die comprising an ESD protection circuit to protect against bi-directional ESD current communicated via the bus.

14. The apparatus of claim 8, wherein the first semiconductor die comprises an ESD protection circuit is to provide at least 10 Amperes of HBM ESD current protection between a line of a bus and the reference voltage node and at least −10 Amperes of HBM ESD current protection between the line of the bus and the reference voltage node.

15. A method comprising:
    directing a first electrostatic discharge (ESD) current of a first direction from a first signal pad to a ground supply node, via a first portion of an ESD protection circuit, the first portion of the ESD protection circuit comprising:
        a first diode having a first terminal coupled to the first signal pad and a second terminal; and
        a first insulated gate bipolar transistor (IGBT) having an emitter coupled to the second terminal of the first diode and a collector coupled to the ground supply node;
    directing a second ESD current of a second direction from the ground supply node to the first signal pad, via a second portion of the ESD protection circuit, the second portion of the ESD protection circuit comprising:
        a second diode having a second terminal coupled to the first signal pad and a first terminal; and
        a second IGBT having a collector coupled to the first terminal of the second diode and an emitter coupled to the ground supply node; and
    sending sensing information from a first die comprising a sensor to a second die comprising the ESD protection circuit.

16. The method of claim 15, further comprising providing bi-directional ESD protection to the first signal pad via the ESD protection circuit.

17. The method of claim 16, further comprising providing at least 10 Amperes of HBM ESD current protection between a line of a bus and the ground supply node and at least −10 Amperes of HBM ESD current protection between the line of the bus and the ground supply node.

18. The method of claim 17, further comprising directing a signal to the bus via the first signal pad.

19. The method of claim 15, further comprising sending the sensing information from the first die to a bus coupled to the second die.

* * * * *